United States Patent
Samukawa et al.

(10) Patent No.: US 8,828,886 B2
(45) Date of Patent: Sep. 9, 2014

(54) LOW DIELECTRIC CONSTANT INSULATING FILM AND METHOD FOR FORMING THE SAME

(75) Inventors: Seiji Samukawa, Sendai (JP); Shigeo Yasuhara, Sendai (JP); Shingo Kadomura, Atsugi (JP); Tsutomu Shimayama, Kumamoto (JP); Hisashi Yano, Joyo (JP); Kunitoshi Tajima, Kyoto (JP); Noriaki Matsunaga, Chigasaki (JP); Masaki Yoshimaru, Hachioji (JP)

(73) Assignee: Tohoku University, Sendai-shi (JP)

( * ) Notice: Subject to any disclaimer, the term of this patent is extended or adjusted under 35 U.S.C. 154(b) by 0 days.

(21) Appl. No.: 13/440,480

(22) Filed: Apr. 5, 2012

(65) Prior Publication Data

US 2012/0190212 A1 Jul. 26, 2012

Related U.S. Application Data

(60) Provisional application No. PCT/JP2010/067449, filed on Oct. 5, 2010.

(30) Foreign Application Priority Data

Oct. 5, 2009 (JP) .................. 2009-231912
Oct. 21, 2009 (JP) .................. 2009-242692

(51) Int. Cl.
| | | |
|---|---|---|
| H01L 21/312 | (2006.01) | |
| C09D 183/04 | (2006.01) | |
| H01L 21/02 | (2006.01) | |
| C23C 16/48 | (2006.01) | |
| C23C 16/40 | (2006.01) | |

(52) U.S. Cl.
CPC .... *H01L 21/02126* (2013.01); *H01L 21/02277* (2013.01); *C23C 16/486* (2013.01); *H01L 21/02216* (2013.01); *C23C 16/401* (2013.01)

USPC .................... 438/780; 524/588; 257/E21.259

(58) Field of Classification Search
None
See application file for complete search history.

(56) References Cited

U.S. PATENT DOCUMENTS

| | | |
|---|---|---|
| 7,202,564 B2 | 4/2007 | Nguyen et al. |
| 7,494,938 B2 | 2/2009 | Nguyen et al. |

(Continued)

FOREIGN PATENT DOCUMENTS

| | | |
|---|---|---|
| JP | 2008-530821 | 8/2008 |
| JP | 2009-021442 | 1/2009 |

(Continued)

OTHER PUBLICATIONS

Yasuhara et al. Structure-Designable Formation-Method of Super Low-k SiOC Film (k=2.2) by Neutral-Beam-Enhanced-CVD, IEEE, 2008, pp. 73-75.*

(Continued)

*Primary Examiner* — Robert S Loewe
(74) *Attorney, Agent, or Firm* — Oblon, Spivak, McClelland, Maier & Neustadt, L.L.P.

(57) ABSTRACT

Disclosed is a low dielectric constant insulating film formed of a polymer containing Si atoms, O atoms, C atoms, and H atoms, which includes straight chain molecules in which a plurality of basic molecules with an SiO structure are linked in a straight chain, binder molecules with an SiO structure linking a plurality of the straight chain molecules. The area ratio of a signal indicating a linear type SiO structure is 49% or more, and the signal amount of the signal indicating $Si(CH_3)$ is 66% or more.

17 Claims, 10 Drawing Sheets

(56) References Cited

U.S. PATENT DOCUMENTS

2004/0253777 A1    12/2004    Miyoshi et al.
2008/0114115 A1*    5/2008    Iida et al. .................. 524/439

FOREIGN PATENT DOCUMENTS

| JP | 2009-290025 | 12/2009 |
| JP | 2009-290026 | 12/2009 |
| WO | WO 03/019645 | 3/2003 |

OTHER PUBLICATIONS

Yasuhara et al. Structure-Designable Method to form Super Low-k SiOC Film (k=2.2) by Neutral-Beam-Enhanced Chemical Vapor Deposition, J. Phys. D: Appl. Phys. 42, 2009, 055208, 7 pages.*

Yasuhara et al. Super-low-k SiOCH film (k=1.9) with extremely high water resistance and thermal stability by neutral-beam-enhanced CVD, J. Phys. D: Appl. Phys. 43, 2010, 065203, 8 pages.*

Yasuhara et al. "Impact of film structure on damage to low-k SiOCH film during plasma exposure" J. Phys. D: Appl. Phys. 42, 2009, 235201, 8 pages.*

International Search Report issued Dec. 7, 2010 in PCT/JP2010/067449 filed Oct. 5, 2010.

Shin-Ichi Nakao, et al.; "UV/EB Cure Mechanism for Porous PECVD/SOD Low-k SiCOH Materials"; IITC, IEEE, 2006, pp. 66-68.

Y. Hayashi, et al.; "Novel Molecular-structure Design for PECVD Porous SiOCH Films toward 45nm-node, ASICs with k=2.3"; IITC, IEEE, 2004, pp. 225-227.

N. Tajima, et al.; "First-Principle Molecular Model of PECVD SiOCH Film for the Mechanical and Dielectric Property Investigation"; IITC, IEEE, 2005, pp. 66-68.

* cited by examiner

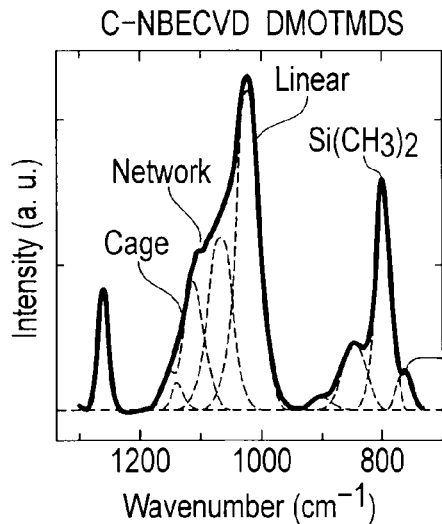
F I G. 12A
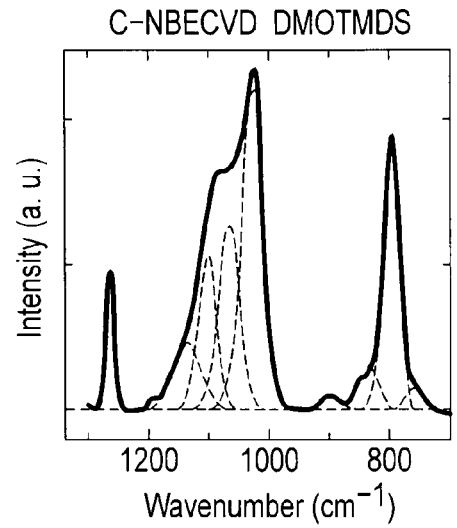
F I G. 12B
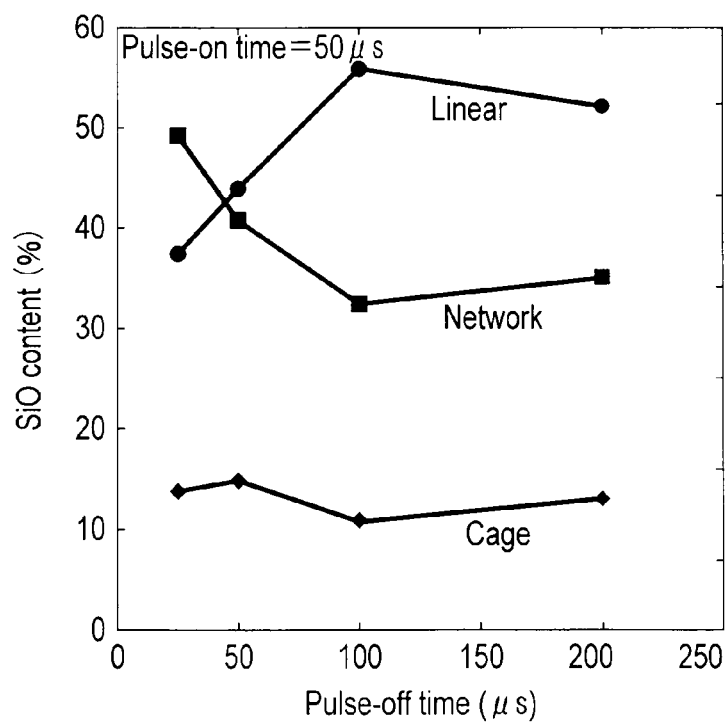
F I G. 13

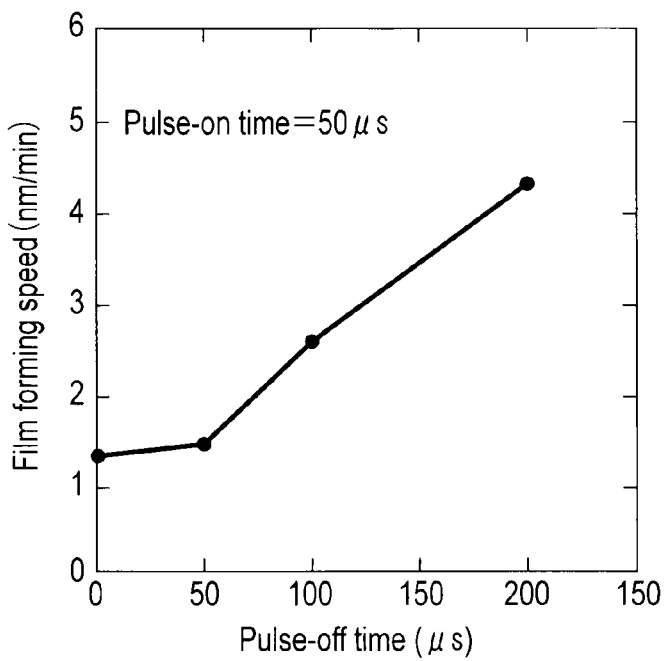
F I G. 14
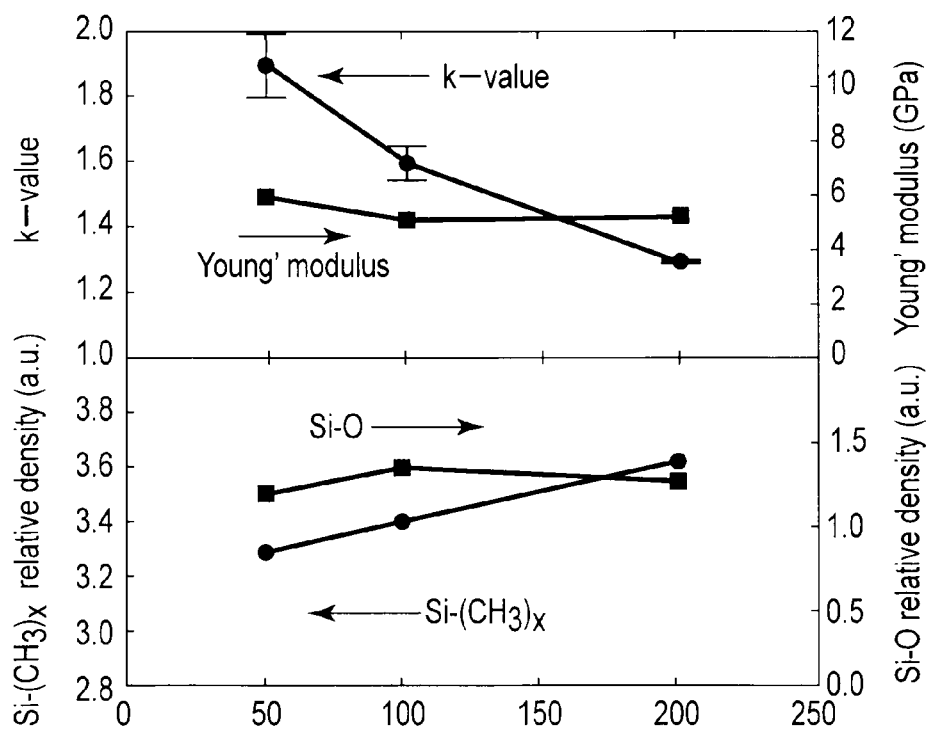
F I G. 15

US 8,828,886 B2

LOW DIELECTRIC CONSTANT INSULATING FILM AND METHOD FOR FORMING THE SAME

CROSS REFERENCE TO RELATED APPLICATIONS

This application is a Continuation application of PCT Application No. PCT/JP2010/067449, filed Oct. 5, 2010 and based upon and claiming the benefit of priority from prior Japanese Patent Applications No. 2009-231912, filed Oct. 5, 2009; and No. 2009-242692, filed Oct. 21, 2009, the entire contents of all of which are incorporated herein by reference.

BACKGROUND OF THE INVENTION

1. Field of the Invention

The present invention relates to a low dielectric constant insulating film and a method for forming the same. In particular, the present invention relates to an insulating film having a low dielectric constant as well as a high mechanical strength and a high damage resistance, and a method for forming the same.

2. Description of the Related Art

With increase in integration degree and operation speed of semiconductor devices, it is demanded to drop a capacity between wirings. In order to drop the capacity between wirings, it is necessary to develop a technique of lowering dielectric constant of an interlayer insulating film. For that reason, an insulating film having a dielectric constant of 3.0 or less, so-called low-k film has been studied.

Conventionally, the low-k film has been produced by a plasma CVD method. In the plasma CVD method, a substrate is placed on a stage in a chamber, a raw gas containing for example, $CH_3$ group is introduced into the chamber, and the raw gas is ionized to produce plasma and is polymerized, thus depositing a low-k film on the substrate (see, for example, Shin-Ichi Nakao et al. "UV/EB Cure Mechanism for Porous PECVD/SOD Low-k SiCOH Materials", IITC, 2006 IEEE, p. 66-68, Y. Hayashi et al. "Novel Molecular-structure Design for PECVD Porous SiOCH Filmes toward 45 nm-node, ASICs with k=2.3", IITC, 2004 IEEE, p. 225-227, N. Tajima et al. "First-principle Molecular Model of PECVD SiOCH Film for the Mechanical and Dielectric Property Investigation", IITC, 2005 IEEE, p. 66-68).

In the conventional method of producing the low-k film using the plasma CVD method, however, precursor molecules contained in the raw gas are dissociated more than necessary by high energy electrons, ultraviolet rays, or photons emitted from plasma. For example, $CH_3$ group is eliminated from Si—CH bond in the precursor molecules to an excessive degree by excessive energy of electrons, ultraviolet rays, or photons. Similarly, organic group is eliminated from the low-k film deposited on the substrate. Thus, where dissociation of gases is promoted by means of generation of plasma, it is impossible to form a CVD film having a desired molecular structure. It is therefore difficult to form a film having a desired dielectric constant (k<2.2) and high strength (Young's modulus of elasticity 4.0).

Further, in order to drop a dielectric constant of the film, various methods have been employed. Those methods include incorporating many organic groups into the film to increase steric hindrance structure and to lower the film density, and adding porogen to the film and burning it to form pores in the film and to lower the film density. However, assuming that k value of the raw gas molecule is 3.0, a porosity of about 50% is necessary in order to form an insulation film having k value of 2.0 or less. In the method of adding porogen, therefore, there is a relation of a trade-off between dielectric constant and mechanical strength.

For example, a molecular pore stacking (MPS) film having a low dielectric constant induced by forming pores of molecule size in the film, is proposed. However, thus formed MPS film has k value of only about 2.4. In order to lower dielectric constant of the MPS film, it is necessary to expand a diameter of a SiO ring. In this case, however, strength of the film drops.

In order to lower dielectric constant with keeping strength of the film, it is proposed to introduce $SiO_2$ content into the raw molecules. This technique, however, lowers a concentration of $CH_3$ in the film by increasing $SiO_2$ content in the film to deteriorate resistance to plasma damage. In general, it is said that the film having a low dielectric constant and high strength has a low resistance to plasma damage.

On the other hand, as the technique of reflecting the structures of raw gas molecules in a deposited film without destroying the structures of raw gas molecules, NBE-CVD method is proposed. In the NBE-CVD method, the raw gas molecules adsorbed onto the surface of the substrate are irradiated with neutral beams to polymerize the raw gas molecules and deposit an insulating film on the substrate.

In the NBE-CVD method, since the raw gas and the deposited film are not irradiated with ions and UV light unlike the conventional plasma CVD method, it is possible to realize irradiation of a very low energy and to synthesize a film material without destroying the structures of the raw gas molecules. Particularly, in SiO—OCH$_3$ based gas having a methoxy group, since bonding energy of between O atom and $CH_3$ group is weak, it is possible to synthesize a low-k film of $SiOCH_3$ series by cutting the bond between O atom and $CH_3$ group. According to this technique, since the irradiation energy is relatively low and Si—$CH_3$ bond are hardly cut, it is possible to incorporate $CH_3$ of a high concentration in the film.

The NBE-CVD method, however, has a drawback that the film forming speed is low since it utilizes an adsorption phenomenon of the raw gas molecules onto the substrate. In this case, since the adsorption probability is improved by increasing molecular weight of the raw gas, it is possible to improve the film forming speed. However, when irradiation of neutral particle beams is continuously performed, a temperature of the substrate rises to lower the adsorption probability of the raw gas molecules, and a film of uniform quality is not obtained.

BRIEF SUMMARY OF THE INVENTION

It is an object of the present invention to provide a low dielectric constant insulating film having a low dielectric constant, a high mechanical strength and a high damage resistance.

It is another object of the present invention to provide a method of forming a low dielectric constant insulating film having a uniform film quality at high film forming speed.

According to a first aspect of the present invention, there is provided a low dielectric constant insulating film formed of a polymer containing Si atoms, O atoms, C atoms, and H atoms, which comprises straight chain molecules in which a plurality of basic molecules with an SiO structure are linked in a straight chain, and binder molecules with an SiO structure linking a plurality of the straight chain molecules, wherein the area ratio of a signal indicating a linear type SiO structure is 49% or more, when the total of the signal areas of a peak signal indicating a linear SiO structure appearing in the vicinity of wavenumber of 1020 cm$^{-1}$, a peak signal indicating a network SiO structure appearing in the vicinity of wavenumber of 1080 $cm^{-1}$, and a peak signal indicating a cage SiO structure appearing in the vicinity of wavenumber of 1120 $cm^{-1}$, from among the peak signals of a spectrum obtained by analyzing the low dielectric constant insulating film by a Fourier transform infrared spectroscopy, is 100%, and the signal amount of the signal indicating $Si(CH_3)_2$ is 66% or more, when the total of the signal amounts of a signal indicating $Si(CH_3)$ appearing in the vicinity of wavenumber of 770 $cm^{-1}$ and a signal indicating $Si(CH_3)_2$ appearing in the vicinity of wavenumber of 800 $cm^{-1}$ from among the peak signals of the spectrum, is 100%.

According to a second aspect of the present invention, there is provided a method of forming the low dielectric constant insulating film, which comprises irradiating a substrate placed in an atmosphere of a raw gas with neutral beams, and dissociating the raw gas adsorbed to a surface of the substrate to cause polymerization and thereby to form a low dielectric constant insulating film, wherein the substrate is intermittently irradiated with the neutral beams in a 1 m second cycle.

According to one aspect of the present invention, there is provided a low dielectric constant insulating film having a low dielectric constant, a high mechanical strength and a high damage resistance.

According to another aspect of the present invention, there is provided a method of forming a low dielectric constant insulating film having a uniform film quality at high film forming speed.

BRIEF DESCRIPTION OF THE SEVERAL VIEWS OF THE DRAWING

FIG. 12A is a diagram showing a spectrum obtained by analyzing the insulating films formed by the NBE-CVD method with the substrate being cooled to −20° C.;

FIG. 12B is a diagram showing a spectrum obtained by analyzing the insulating films formed by the NBE-CVD method with the substrate being cooled to −70° C.;

FIG. 13 is a view showing a change in composition of SiO structure in an insulating film depending on pulse-off time;

FIG. 14 is a view showing a film forming speed depending on pulse-off time; and

FIG. 15 is a view showing a change in k value, Young' modulus, and relative densities of $Si-(CH_3)_x$ and $Si-O$.

DETAILED DESCRIPTION OF THE INVENTION

There will now be described embodiments of the present invention with reference to drawings.

A low dielectric constant insulating film according to a first embodiment of the present invention is formed of a polymer containing Si atoms, O atoms, C atoms, and H atoms, and comprises straight chain molecules in which a plurality of basic molecules with an SiO structure are linked in a straight chain, and binder molecules with an SiO structure linking a plurality of the straight chain molecules.

The area ratio of a signal indicating a linear type SiO structure is 49% or more, when the total of the signal areas of a peak signal indicating a linear SiO structure appearing in the vicinity of wavenumber of 1020 $cm^{-1}$, a peak signal indicating a network SiO structure appearing in the vicinity of wavenumber of 1080 $cm^{-1}$, and a peak signal indicating a cage SiO structure appearing in the vicinity of wavenumber of 1120 $cm^{-1}$, from among the peak signals of a spectrum obtained by analyzing said low dielectric constant insulating film by a Fourier transform infrared spectroscopy, is 100%, and the signal amount of the signal indicating $Si(CH_3)_2$ is 66% or more, when the total of the signal amounts of a signal indicating $Si(CH_3)$ appearing in the vicinity of wavenumber of 770 $cm^{-1}$ and a signal indicating $Si(CH_3)_2$ appearing in the vicinity of wavenumber of 800 $cm^{-1}$ from among the peak signals of said spectrum, is 100%.

In this low dielectric constant insulating film, the area ratio of the signal indicating the cage SiO structure can be 10 to 25%.

Further, the signal amount of the signal indicating $Si(CH_3)_2$ can be 80% or more.

Furthermore, the linear molecule can be dimmer or more of methyl siloxane, and the binder molecule can be one selected from the group consisting of $SiO_2$, $SiO_{1.5}(CH_3)$, and $SiO(CH_3)_2$.

Still further, a content of C atoms in the polymer can be 36-50% when the total amount of the Si atoms, O atoms, C atoms, and H atoms in the polymer containing Si atoms, O atoms, C atoms, and H atoms is 100%.

The low dielectric constant insulating film described above can be produced by a neutral-beam-enhanced CVD process using dimmer or more of methyl siloxane as a raw gas. In this case, the dimmer or more of methyl siloxane can be dimethoxy tetramethyl disiloxane.

Figure 1:
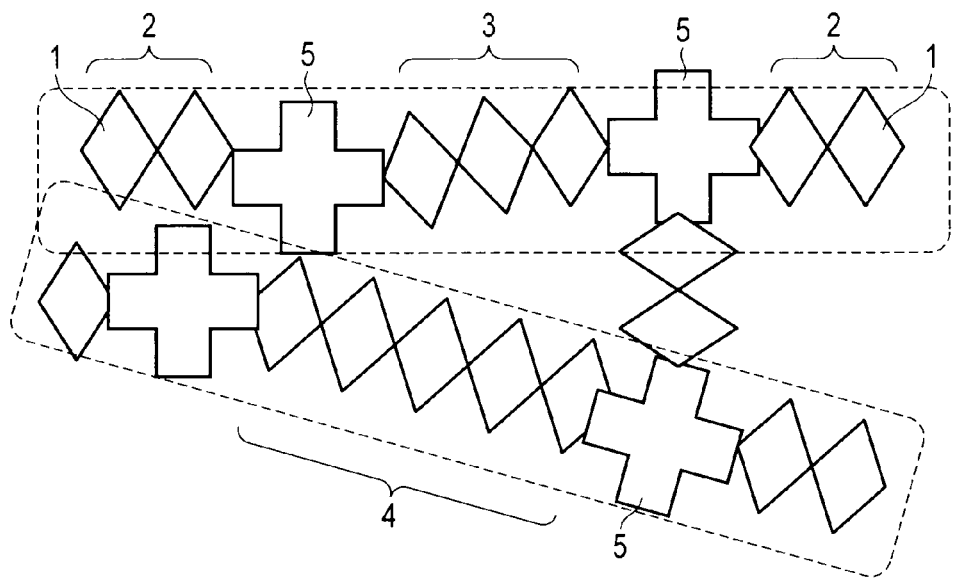
FIG. 1 is a diagram schematically illustrating a molecule structure of a low dielectric constant insulating film according to a first embodiment of the present invention.

FIG. 1 is a model view showing a structure of the low dielectric constant insulating film according to the first embodiment of the present invention.

In FIG. 1, a plurality of fundamental molecules 1 each represented by a diamond shape are linked in a straight chain to form straight chain molecules 2, 3, 4. The straight chain molecule 2 is a dimer formed by linking two fundamental molecules 1, the straight chain molecule 3 is a trimer formed by linking three fundamental molecules 1, and the straight chain molecule 4 is a tetramer formed by linking four fundamental molecules 1. These straight chain molecules 2, 3, 4 are linked by means of binder molecules 5 each represented by a cross. Incidentally, linkage is not only in a straight chain, but also in a three-dimensional structure as shown in FIG. 1.

FIGS. 2, 3, 4, and 5 show fundamental structures of the polymers containing Si atoms, O atoms, C atoms, and H atoms, which constitute the low dielectric constant insulating film according to the present embodiment.

Figure 2:
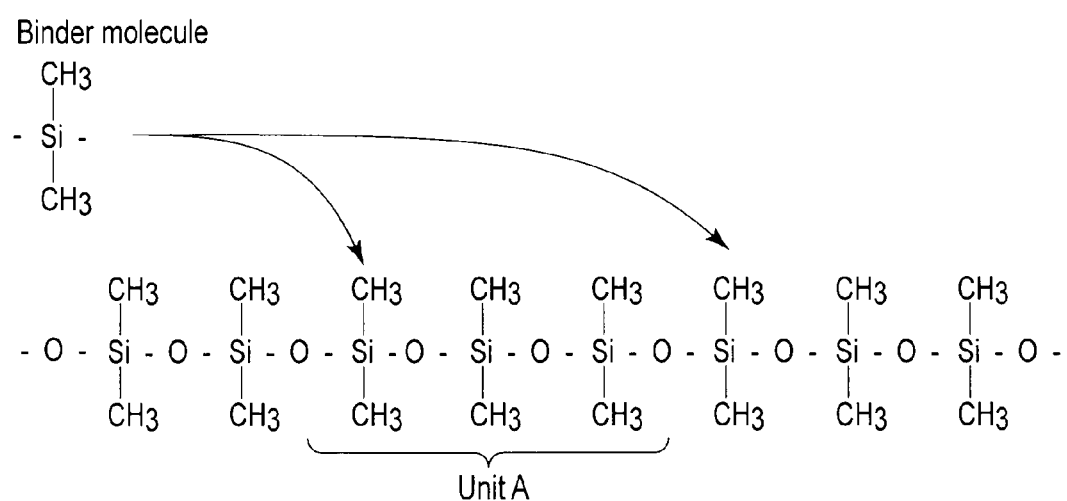
FIG. 2 is a chemical formula showing a first example of a polymer constituting the low dielectric constant insulating film according to a first embodiment of the present invention.

In the structure shown in FIG. 2, the fundamental molecule is dimethyl siloxane ($SiO(CH_3)_2$), and two fundamental molecule are linked to form a dimer (tetramethyl siloxane). The dimers are linked by means of dimethyl silicon ($Si(CH_3)_2$) as a binder molecule to form unit A. A plurality of units A are linked in a straight chain to form the structure shown in FIG. 2.

In this polymer, numbers of Si atoms, O atoms, and C atoms in the unit A are 3, 3, and 6 respectively. Therefore, when the total atomic amounts of Si atoms, O atoms, and C atoms are 100%, atomic amount of C atoms is 50%.

Figure 3:
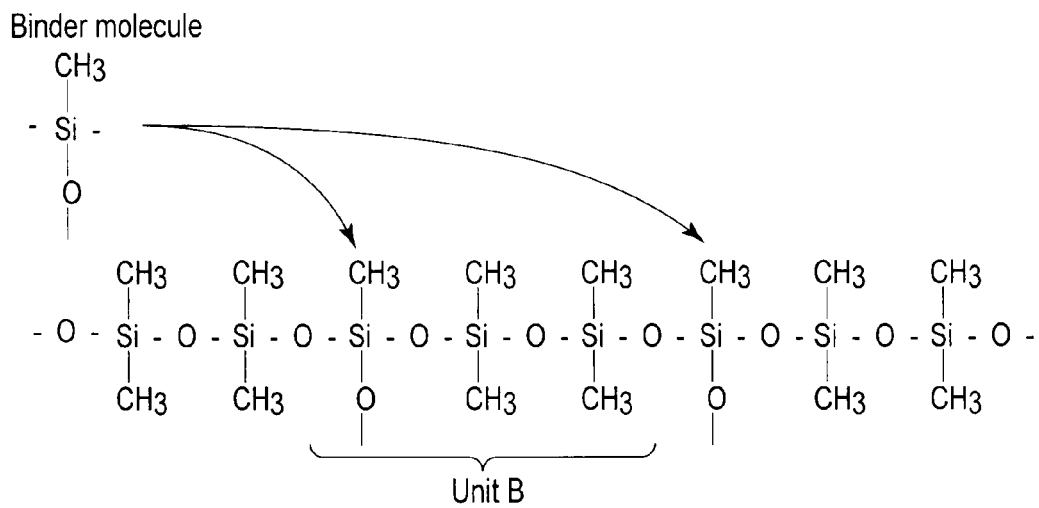
FIG. 3 is a chemical formula showing a second example of a polymer constituting the low dielectric constant insulating film according to a first embodiment of the present invention.

In the structure shown in FIG. 3, the fundamental molecule is dimethyl siloxane ($SiO(CH_3)_2$), and two fundamental molecule are linked to form a dimer (tetramethyl siloxane). The dimers are linked by means of monomethyl siloxane ($SiOCH_3$) as a binder molecule to form unit B. A plurality of units B are linked in a straight chain to form the structure shown in FIG. 3.

In this polymer, numbers of Si atoms, O atoms, and C atoms in the unit A are 3, 3.5, and 5 respectively. Therefore, when the total atomic amounts of Si atoms, O atoms, and C atoms are 100%, atomic amount of C atoms is 43%. Though the polymer has a straight chain structure, it may have a three-dimensional structure in which units are linked by means of O atom of monomethyl siloxane ($SiOCH_3$) as a binder molecule. This polymer of the three-dimensional structure has an improved strength.

Figure 4:
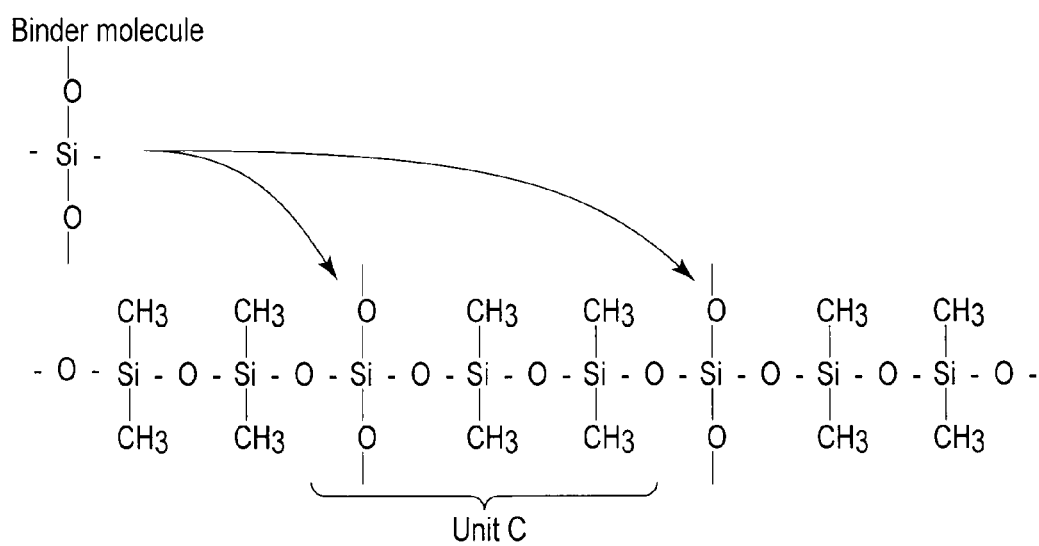
FIG. 4 is a chemical formula showing a third example of a polymer constituting the low dielectric constant insulating film according to a first embodiment of the present invention.

In the structure shown in FIG. 4, the fundamental molecule is dimethyl siloxane ($SiO(CH_3)_2$), and two fundamental molecule are linked to form a dimer (tetramethyl siloxane). The dimers are linked by means of $SiO_2$ as a binder molecule to form unit C. A plurality of units C are linked in a straight chain to form the structure shown in FIG. 4.

In this polymer, numbers of Si atoms, O atoms, and C atoms in the unit A are 3, 4, and 4 respectively. Therefore, when the total atomic amounts of Si atoms, O atoms, and C atoms are 100%, atomic amount of C atoms is 36%. Though the polymer has a straight chain structure, it may have a three-dimensional structure in which units are linked by means of two O atoms of $SiO_2$ as a binder molecule. This polymer of the three-dimensional structure has an improved strength.

Figure 5:
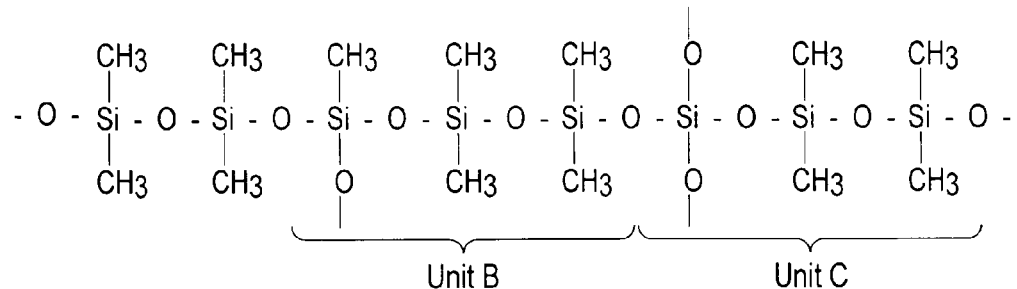
FIG. 5 is a chemical formula showing a fourth example of a polymer constituting the low dielectric constant insulating film according to a first embodiment of the present invention.

A polymer shown in FIG. 5 has a unit structure of a combination of unit B shown in FIG. 3 and unit C shown in FIG. 4.

The fundamental structures shown in FIGS. 2 to 5, the dimer (tetramethyl siloxane), which is formed of two fundamental molecules of dimethyl siloxane ($SiO(CH_3)_2$) linked to one another, has four $CH_3$ groups by two Si atoms. Those straight chain molecules are further linked to form a methyl siloxane polymer of a high C atom concentration. Where two dimers are linked by means of one binder molecule, and the three binders described above are employed, a concentration of C atom in the polymer is 36-50%. Thus, a low dielectric constant and high resistance to damage can be obtained by introducing many $CH_3$ groups into the polymer.

Further, since the methyl siloxane structure having mainly straight chain structure, in which the straight chain molecules are linked by means of a binder of SiO structure to form a dense structure, brings about a high strength to the insulating film unlike the low dielectric constant insulating film to which pores are introduced.

The low dielectric constant insulating film according to the first embodiment of the present invention described above can be produced by CVD method using neutral beams (designated as NBE-CVD method hereinafter). The present inventors have studied the film formation of a low dielectric constant insulating film by NBE-CVD method, and obtained the following findings. More specifically, when a film is formed by NBE-CVD method using a compound having a siloxane bond as a raw gas, a polymer film containing a large amount of straight chain component in which SiO structure and $Si(CH_3)_3$ structure are linked in a straight chain, and thus formed polymer film has a dielectric constant k of 2.2 or less and Young's modulus E of 4 or more.

The compound having a siloxane bond includes for example, dimethoxy tetramethyl disiloxane (DMOTMDS), dimethyl diethoxy silane (DMDEOS), and dimethyl dimethoxy silane (DMDMOS). The other compound can be employed, which includes methyl trimethoxy silane (MT-MOS), trimethyl silane, cyclopentyl trimethoxy silane, bis-trimethoxy silylethane, bis-methyl dimethoxy silylethane, bis-dimethyl methoxy silylethane, and bis-triethoxy silylethane.

In the NBE-CVD method, when a substrate on which a film is formed, is placed in an atmosphere of dimethoxy tetramethyl disiloxane (DMOTMDS), molecules of DMOTMDS are adsorbed onto the surface of the substrate. When the surface of the substrate is irradiated with neutral beams, DMOTMDS is decomposed to selectively eliminate methoxy group portions of DMOTMDS, and the fundamental molecules described above is preferentially formed. The fundamental molecules are linked by means of a binder having a SiO structure in a straight chain to form a polymer film. In this case, accelerating energy need to be adjusted so that the energy of neutral beams on the substrate becomes a bonding energy of methoxy group.

Incidentally, when the substrate is irradiated with pulsed neutral beams (irradiation time: 50 μsec; interval: 200 μsec), an elevation of the substrate temperature can be suppressed and a adsorption time can be kept to a certain time to increase an adsorption probability, and thereby to effectively trap the straight chain structure of $2SiO(CH_3)_2$ into the film. As a result, the low dielectric constant insulating film of k=1.4 and E=5 GPa can be formed. In this case, the insulating film having further low dielectric constant and further high Young' modulus can be obtained by lowering the substrate temperature. Thus, it is possible that low dielectric constant is consistent with high Young' modulus. Since this insulating film has a high C concentration of 40%, it has high resistance to plasma damage.

The present inventors thought that the low dielectric constant, high strength, and high resistance to plasma damage, of the insulating film, which have not been realized, result from the molecule structure specific to the produced film, and analyzed the structure of the film by means of Fourier transform infrared spectroscopy. As a result, the structural requirements for the low dielectric constant, high strength, and high resistance to plasma damage have become clear.

The present inventors have analyzed the low dielectric constant insulating film by means of Fourier transform infrared spectroscopy, and found that there are three SiO structures represented by a peak signal indicating a linear SiO structure appearing in the vicinity of wavenumber of 1020 cm$^{-1}$, a peak signal indicating a network SiO structure appearing in the vicinity of wavenumber of 1080 cm$^{-1}$, and a peak signal indicating a cage SiO structure appearing in the vicinity of wavenumber of 1120 cm$^{-1}$, from among the peak signals of a spectrum obtained by the analysis. Among the three SiO structures, the linear SiO structure is a structure linked in a straight chain as shown in FIG. 2. The network SiO structure is a structure three-dimensionally linked by means of O atom of a binder having a straight chain structure as shown in FIG. 3. The cage SiO structure is a structure three-dimensionally linked by means of two O atoms of a binder having a straight chain structure as shown in FIG. 4.

The low dielectric constant insulating film according to the first embodiment of the present invention includes the linear SiO structure, the network SiO structure, and the cage SiO structure, and is characterized in that the linear SiO structure is a main structure. More specifically, it is necessary that the area ratio of a signal indicating the linear type SiO structure is 49% or more, when the total of the signal areas of a peak signal indicating the linear SiO structure appearing in the vicinity of wavenumber of 1020 cm$^{-1}$, a peak signal indicating the network SiO structure appearing in the vicinity of wavenumber of 1080 cm$^{-1}$, and a peak signal indicating the cage SiO structure appearing in the vicinity of wavenumber of 1120 cm$^{-1}$, from among the peak signals of a spectrum obtained by analyzing the low dielectric constant insulating film by a Fourier transform infrared spectroscopy, is 100%.

Since the insulating film including much linear SiO structure has a densely packed structure in which straight chain molecules are linked by means of a binder of SiO structure, it has a high strength. On the other hand, when the area ratio of a signal indicating the linear type SiO structure is less than 49%, since the insulating film include much network SiO structure and much cage SiO structure, it does not becomes a densely packed structure and has a low strength.

Incidentally, where the insulating film include only linear type SiO structure, it is difficult to obtain a desired strength. It is preferred that the insulating film include the cage SiO structure of about 10%-about 25%.

In the low dielectric constant insulating film according to the first embodiment of the present invention, it is necessary that the signal amount of the signal indicating $Si(CH_3)_2$ is 66% or more, when the total of the signal amounts of a signal indicating $Si(CH_3)$ appearing in the vicinity of wavenumber of 770 cm$^{-1}$ and a signal indicating $Si(CH_3)_2$ appearing in the vicinity of wavenumber of 800 cm$^{-1}$ from among the peak signals of the spectrum, is 100%.

Thus, the insulating film having a low dielectric constant and high resistance to plasma damage is obtained due to high content of $Si(CH_3)_2$. On the other hand, when the signal amount of the signal indicating $Si(CH_3)_2$ is less than 66%, a concentration of $CH_3$ necessary for lowering the dielectric constant to a desired level is not obtained, and therefore a resistance to plasma damage drops due to low concentration of $CH_3$.

Next, there will be described in detail the NBE-CVD method for forming the low dielectric constant insulating film according to the first embodiment of the present invention.

Figure 6:
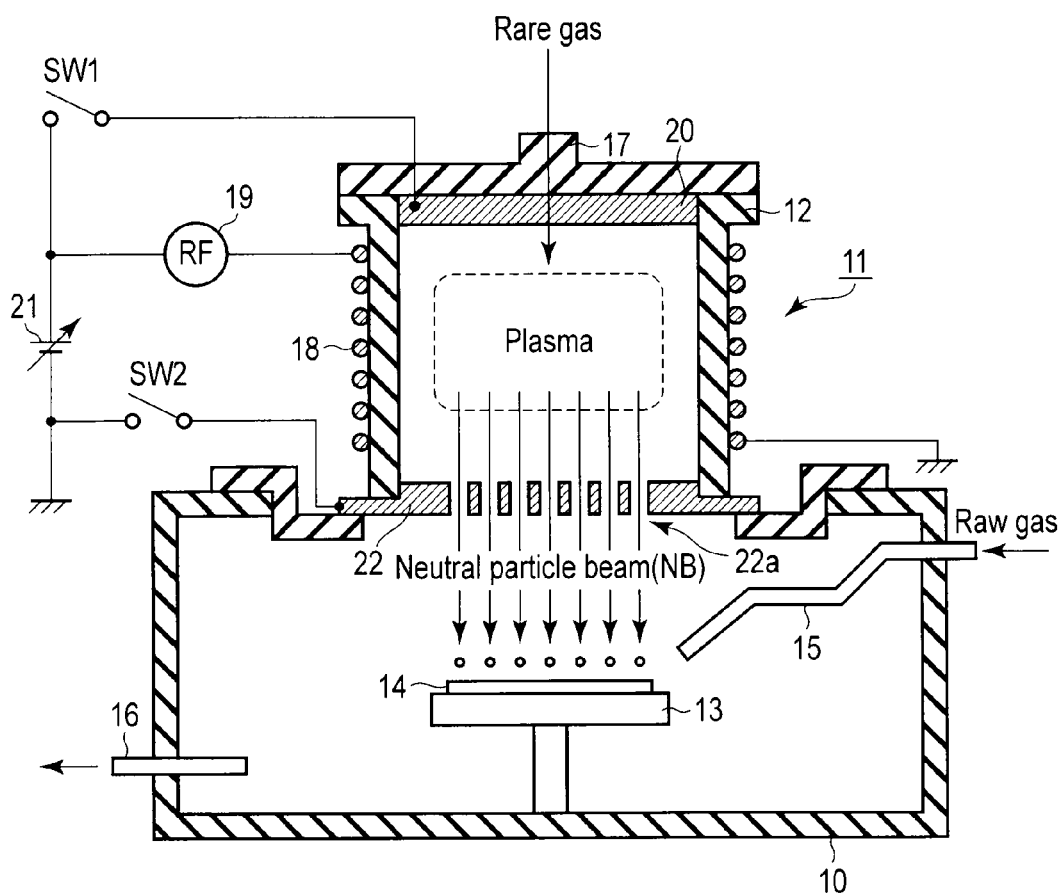
FIG. 6 is a view showing a neutral-beam-enhanced CVD apparatus for forming the low dielectric constant insulating film according to a first embodiment of the present invention, and for employing in a method of forming a low dielectric constant insulating film according to a second embodiment of the present invention.

FIG. 6 shows a CVD apparatus of neutral beams irradiation type (NBE-CVD apparatus) for forming the low dielectric constant insulating film according to the first embodiment of the present invention. In FIG. 6, neutral beams forming section 11 is arranged above a CVD reaction chamber 10 (designated as reaction chamber hereinafter).

A stage 13 on which a substrate 14 is to be placed is arranged in the reaction chamber 10. The stage 13 is provided with a temperature controlling device not shown, and a temperature of the substrate 14 is controlled to the predetermined value. The reaction chamber is provided with a gas inlet 15 and an exhaust mechanism 16. A pressure in the reaction chamber is controlled to the predetermined value by means of the exhaust mechanism 16, and a raw gas is introduced onto the substrate 14 placed on the stage 13 through the gas inlet 15.

The neutral beams forming section 11 is constituted by a plasma chamber 12 made of quartz. An upper portion of the plasma chamber 12 is provided with a gas inlet 17 through which an inert gas such as argon, helium, krypton, etc., is introduced into the plasma chamber 12. The plasma chamber 12 is wound with a coil 18. One edge of the coil 18 is grounded and the other edge of the coil 18 is connected to a high frequency source 19. An anode 20 as an upper electrode is arranged in the upper portion of the plasma chamber 12. The anode 20 is connected to a positive electrode of a direct current source 21 and the high frequency source 19 through a switch SW1. A cathode 22 as a lower electrode is arranged in the lower portion of the plasma chamber 12, i.e., on the boundary between the plasma chamber 12 and the reaction chamber 10. The cathode 22 is connected to a negative electrode of the direct current source 21 through a switch SW2. The direct current source 21 is a variable source and enables an electric field between the anode 20 and the cathode 22 to be variable.

Since it is necessary that the cathode 22 neutralizes positive particles, passes them, and shuts off electrons and UV rays or photons, an aspect ratio and aperture ratio of an opening 22a are set to the predetermined values.

Further, in order to prevent gases in the reaction chamber 10 from flowing into the plasma chamber 12, it is necessary to maintain a pressure difference between the reaction chamber 10 and the plasma chamber 12. More concretely, a pressure in the reaction chamber 10 is set to, for example, 100 mmTorr or more, and a pressure in the plasma chamber 12 is set to 1 torr or more. Therefore, in order to prevent gases in the reaction chamber 10 from flowing into the plasma chamber 12, it is necessary to set the pressure of the reaction chamber 10 to at least 10 times that of the plasma chamber 12. In order to maintain the pressure difference, it is preferred that the aperture ratio of the opening 22 of the cathode 22 is about 30%.

The film formation of the low dielectric constant insulating film by means of NBE-CVD apparatus shown in FIG. 6 is carried out as follows:

A pressure in the plasma chamber 12 is set to, for example, 1 Torr, and an inert gas such as argon is introduced into the plasma chamber 12. In this state, switch SW1 is turned on and a high frequency power is applied to the coil 18 from the high frequency source 19. This high frequency power has a frequency of 13.56 MHz, voltage of 500V, and power of 1 kW. Electrons in the plasma chamber 12 are accelerated by high frequency field generated from the coil 18 and collide with argon gas molecules to decompose the argon gas molecules, thereby generating plasma.

In this state, when switch SW2 is turned on, an electric field is generated between the anode 20 and the cathode 22, and positive charged particles are accelerated by this electric field. The positive charged particles are neutralized by electrons supplied from the cathode 22 to form neutral particle beams (NB), which are introduced into the reaction chamber 10 through a plurality of openings 22a. Then, electrons and UV rays or photons generated in the plasma are shut off by means of the cathode 22 and do not arrive at the reaction chamber 10.

Energy of the neutral particles introduced into the reaction chamber 10 is controlled by an accelerating voltage of ions generated in the plasma, and the accelerating voltage is changed by controlling the direct current source 21.

The substrate 14 is placed on the stage, temperature of which is controlled, in the reaction chamber 10. When DMOTMDS as a raw gas is introduced into the reaction chamber 10 through the gas inlet 15, the molecules of DMOTMDS are adsorbed onto the surface of the substrate 14. The neutral particles introduced from the plasma chamber 12 collide with the molecules of DMOTMDS. On this collision, kinetic energy of the neutral particles is converted to thermal energy. The thermal energy assists dissociation of a certain bond of the gas molecules adsorbed onto the substrate to activate the gas. The activated gas is subjected to polymerization reaction to deposit on the substrate 14 in order.

Figure 7:
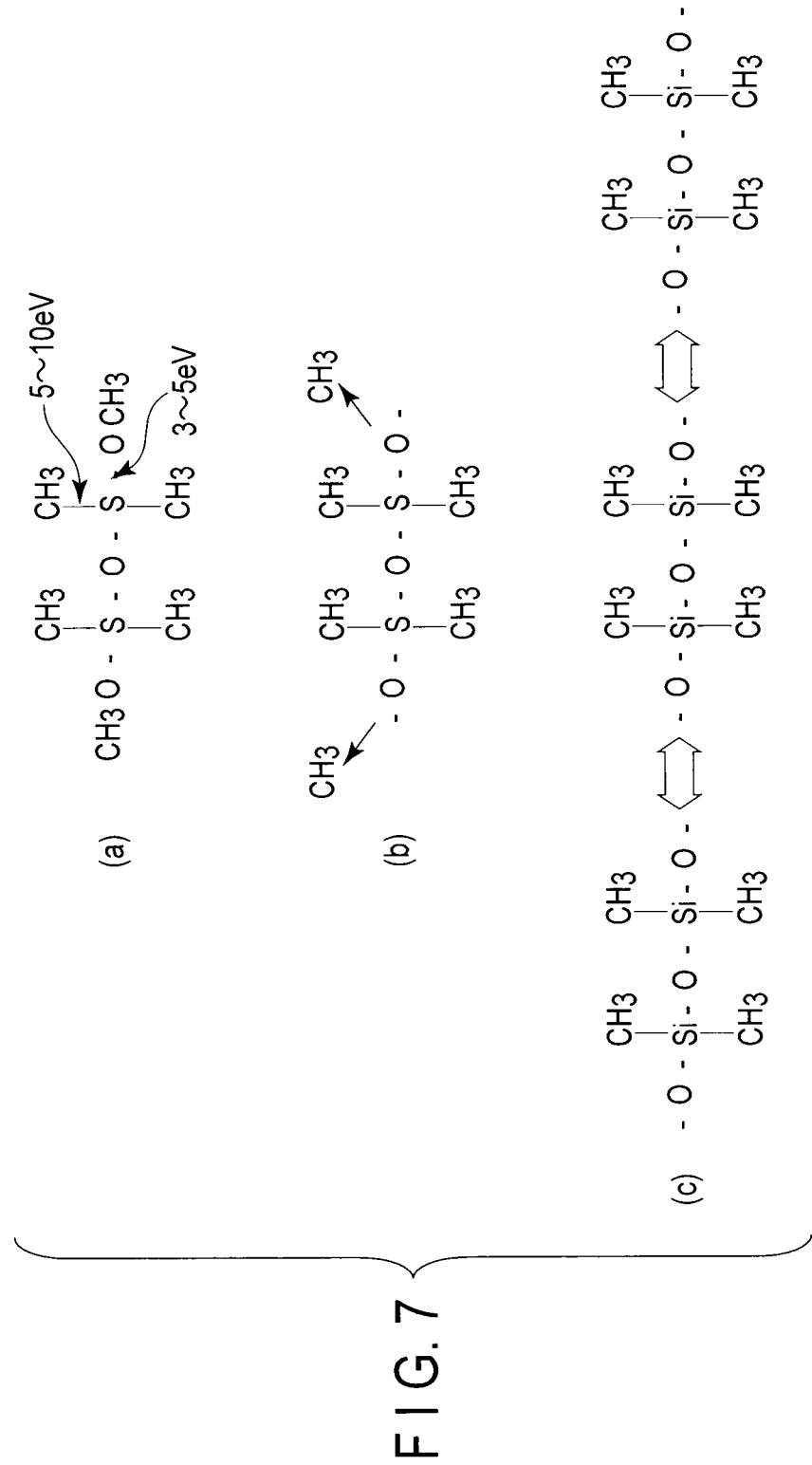
FIG. 7 is a chemical formula showing a molecule structure of DMOTMDS, elimination of methyl group, and a linking in straight chain of dimer of dimethyl siloxane.

FIG. 7(*a*) shows a relation between a molecule structure of DMOTMDS and a bonding energy of DMOTMDS. In the case of DMOTMDS, bonding energies of O—$CH_3$ and Si—$CH_3$ are about 3-5 eV and 5-10 eV, respectively. In the present embodiment, it is necessary to dissociate O—$CH_3$ bond. For this reason, it is desired to irradiate the DMOTMDS molecules adsorbed onto the substrate with the neutral particle beams having a energy not less than the bonding energy of O—$CH_3$ and not more than the bonding energy of Si—$CH_3$. More specifically, the DMOTMDS molecules are irradiated with the neutral particle beams having energy of 3-5 eV given thereto by controlling the direct current source 21. As a result, a bond of O and methyl group ($CH_3$) is dissociated to bond two fundamental molecules of dimethyl siloxane, and thereby to form a dimer (tetramethyl disiloxane), as shown in FIG. 7(*b*). These dimmers are linked in a straight chain to deposit a low dielectric constant insulating film containing Si atom, O atom, and C atom on the substrate 14, as shown in FIG. 7(*c*).

In this case, the dimmers are not linked without the binder described above. In the NBE-CVD method, various dissociations other than that of O—$CH_3$ occur to produce various binders such as $SiO(CH_3)_2$, $SiO_{1.5}(CH_3)$, and $SiO_2$, as described above. The dimmers (tetramethyl siloxane) are linked in a straight chain by means of the binder to form the low dielectric constant insulating film consisting of a polymer shown in FIGS. 2-5.

Figure 8:
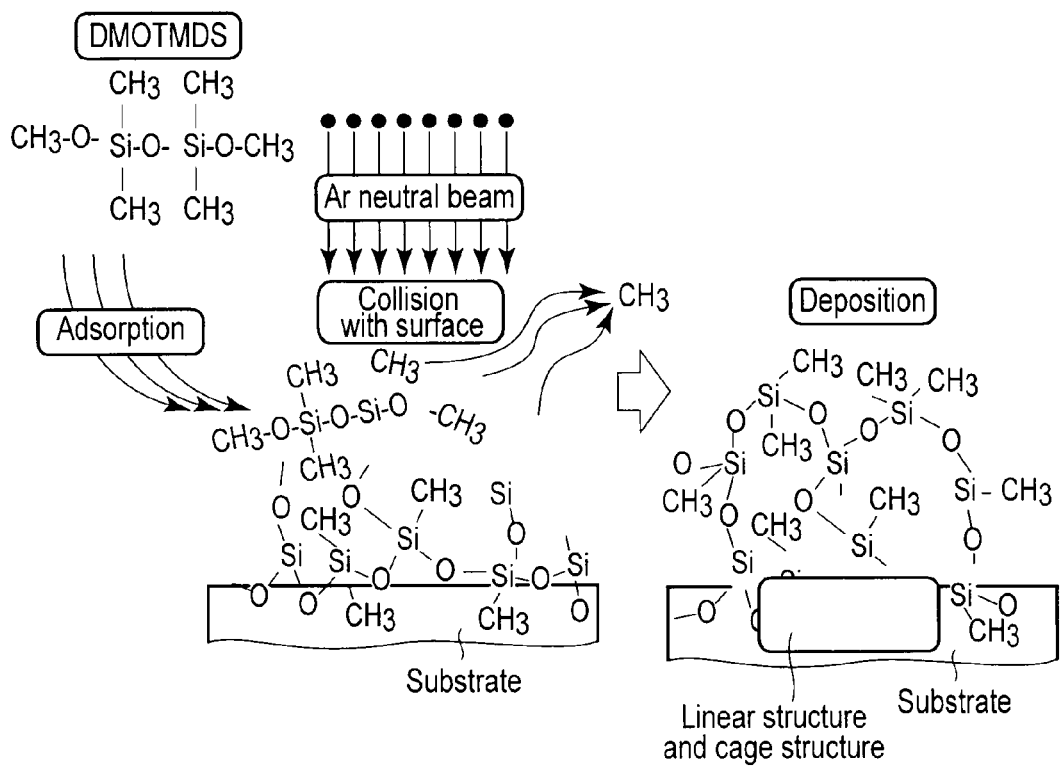
FIG. 8 is a diagram schematically illustrating a process of forming a low dielectric constant insulating film according to a first embodiment of the present invention.

An outline of process for forming the low dielectric constant insulating film is shown in FIG. 8. As seen from FIG. 8, DMOTMDS molecules are adsorbed onto the surface of the substrate, $CH_3$ group is eliminated by irradiation of neutral particle beams, and a polymer containing a linear SiO structure and a cage SiO structure is deposited.

In the present embodiment, the irradiation of neutral particles beams is carried out not only continuously, but also intermittently. Intermittent irradiation suppresses the elevation of the substrate temperature during film forming and improves the adsorption efficiency of the raw gas, thereby enabling to perform effectively polymerization. Further, since the low substrate temperature improves the adsorption efficiency of the raw gas, it is preferred to form a film at a temperature of 0° C. or less.

The low dielectric constant insulating film formed by NBE-CVD method is described hereinbefore. The present invention is not limited to this, and can be applied to the low dielectric constant insulating film formed by the other method.

A method of forming the low dielectric constant insulating film according to a second embodiment of the present invention is a method which enables the low dielectric constant insulating film according to the first embodiment of the present invention described above to be form and comprises irradiating a substrate placed in an atmosphere of a raw gas with neutral beams, and dissociating the raw gas adsorbed to a surface of the substrate to cause polymerization and thereby to form a low dielectric constant insulating film, wherein the substrate is intermittently irradiated with the neutral beams in a 1 m second cycle.

In the method of forming the low dielectric constant insulating film, irradiation time $T_{on}$ and irradiation cycle $T_{off}$ of the neutral beams can satisfy inequality $T_{on} \leq T_{off}$. Further, the irradiation time $T_{on}$ can be not less than 50 μseconds and the irradiation cycle $T_{off}$ is not less than 50 μseconds.

A compound having a siloxane bond can be used as the raw gas. The compound having a siloxane bond can be a dimmer or more of methylsiloxane. The dimmer or more of methylsiloxane includes dimethoxytrimethyldisiloxane.

Further, the substrate can be cooled to a temperature of 0° C. or less.

There will be described the principal of the method of forming the low dielectric constant insulating film according to the second embodiment of the present invention.

The present inventors have studied the film formation of the low dielectric constant insulating by NBE-CVD method, and acquired the following findings. Namely, when a film is formed on a substrate using a compound having a siloxane bond as a raw gas by NBE-CVD method, a temperature of the substrate rises and an adsorption efficiency of the raw gas is lowered, and thus film formation speed is lowered and the film quality deteriorates. Since polymerization of the raw gas occurs by irradiation of the neutral particle beams, film formation speed should increase due to continuous irradiation of the neutral particle beams. However, if there are no adsorbed gas molecules on the substrate, polymerization does not occur and the film formation speed is lowered.

Furthermore, the formed film generates gas such as $H_2O$ and a compound having $CH_3$ group on annealing after film formation. Since these gases are not generated on the second annealing, it is thought that generation of gases is due to molecules remained in the insulating film.

On the other hand, the present inventors have found that all of those problems are resolved by intermittent irradiation of neutral particle beams in a 1 m second cycle. More specifically, when a raw gas is supplied onto a surface of the substrate and the substrate is intermittently irradiated with neutral beams in a 1 m second cycle, the substrate is prevented from rise in temperature and an adsorption efficiency of the raw gas is increased, and thus film formation speed becomes high and the film quality is improved. Further, generation of gases from the film on the annealing after film formation is suppressed.

There will now be described the above-mentioned phenomena in reference to FIG. 9.

Figure 9:
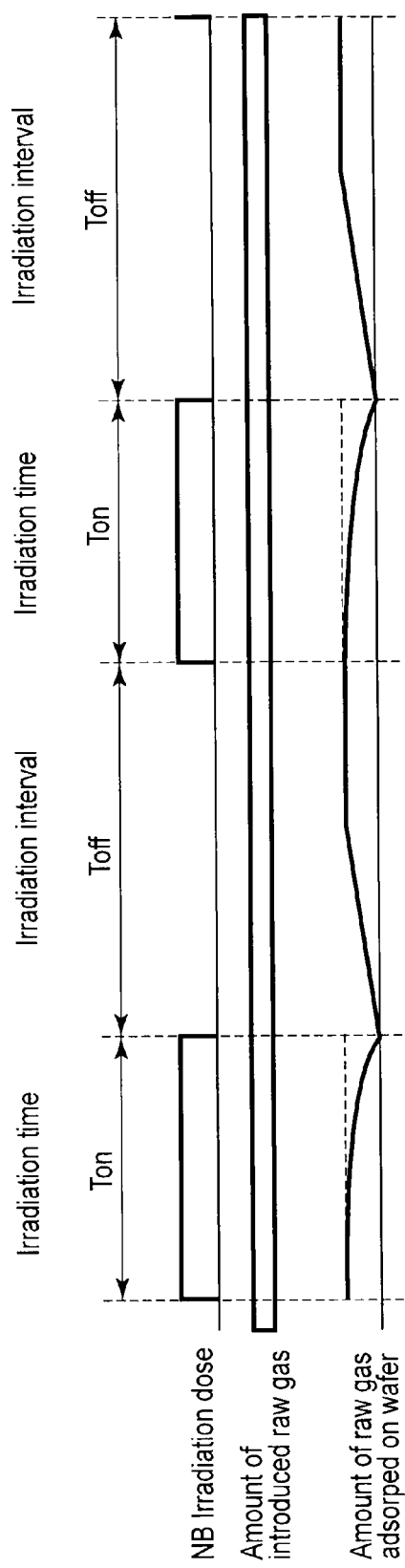
FIG. 9 is a view showing a NB irradiation sequence of NBE-CVD in a method of forming a low dielectric constant insulating film according to a second embodiment of the present invention.

FIG. 9 shows a NB irradiation sequence of NBE-CVD in which a substrate is irradiated intermittently with neutral particle beams during supplying a raw gas onto the substrate to form a film on the substrate. As shown in FIG. 9, the raw gas is supplied onto the substrate at a constant flow rate, and the substrate is irradiated intermittently with neutral particle beams in a pulsed form at prescribed intervals. When the substrate is irradiated with NB for irradiation time $T_{on}$ in a constant dose, polymerization of the raw gas adsorbed onto the surface of the substrate proceeds to form a film on the substrate, whereas since a temperature of the substrate rises, an amount of the raw gas adsorbed on the substrate is gradually reduced and reaches minimum at an endpoint of irradiation time $T_{on}$.

Since irradiation of the neutral particle beams is stopped for a time interval in the irradiation cycle $T_{off}$, elevation of the temperature of the substrate is suppressed, whereas, since the raw gas is supplied to the substrate, an amount of the raw gas adsorbed on the substrate is increased and reach a constant amount at a middle point for a time interval in the irradiation cycle $T_{off}$. Since these phenomena are alternately repeated and a sufficient amount of the raw gas is adsorbed on the substrate, irradiation energy can be effectively utilized for film formation to improve the film forming speed and film quality.

In this case, it is necessary to set a cycle ($T_{on}+T_{off}$) of an intermittent irradiation to less than 1 millisecond (ms) (generally, a few 10 μs to subμs). When cycle of intermittent irradiation is not less than 1 ms, it is difficult to form a film. The irradiation time $T_{on}$ and irradiation cycle $T_{off}$ of the neutral beams preferably satisfy inequality $T_{on} \leq T_{off}$. When $T_{on}$ and $T_{off}$ satisfy inequality $T_{on} > T_{off}$, a temperature of the substrate rises easily, and the forming speed of the film tends to drop. It is preferred that the irradiation time $T_{on}$ is not less than 50 μseconds and the irradiation cycle $T_{off}$ is not less than 100 μseconds. When the irradiation time $T_{on}$ is less than 50 μseconds and the irradiation cycle $T_{off}$ is less than 100 μseconds, the forming speed of the film tends to drop too.

Further, since low substrate temperature brings about improved adsorbing efficiency of the raw gas onto the substrate, it is desired to cool the substrate to a temperature of not more than 0° C. during intermitted irradiation of neutral particle beams. Also the supply of the raw gas can be performed intermittently as well as irradiation of neutral particle beams.

Incidentally, energy of NB irradiation on the substrate is desirably set to such a value that a center value of energy on the substrate is preferably 10 eV or less, more preferably 6 eV or less. It is desirable that the energy of NB irradiation is properly selected depending on a bonding energy of that portion of the raw gas molecule which is desired to be cut, described after.

In the above description, one kind of raw gas is employed. However, two kinds of raw gases can be changed from one another at a middle point of the film forming process. Alternative embodiment in which two kinds of raw gases is changed from one another, is described in reference to NB irradiation sequence of FIG. 10.

Figure 10:
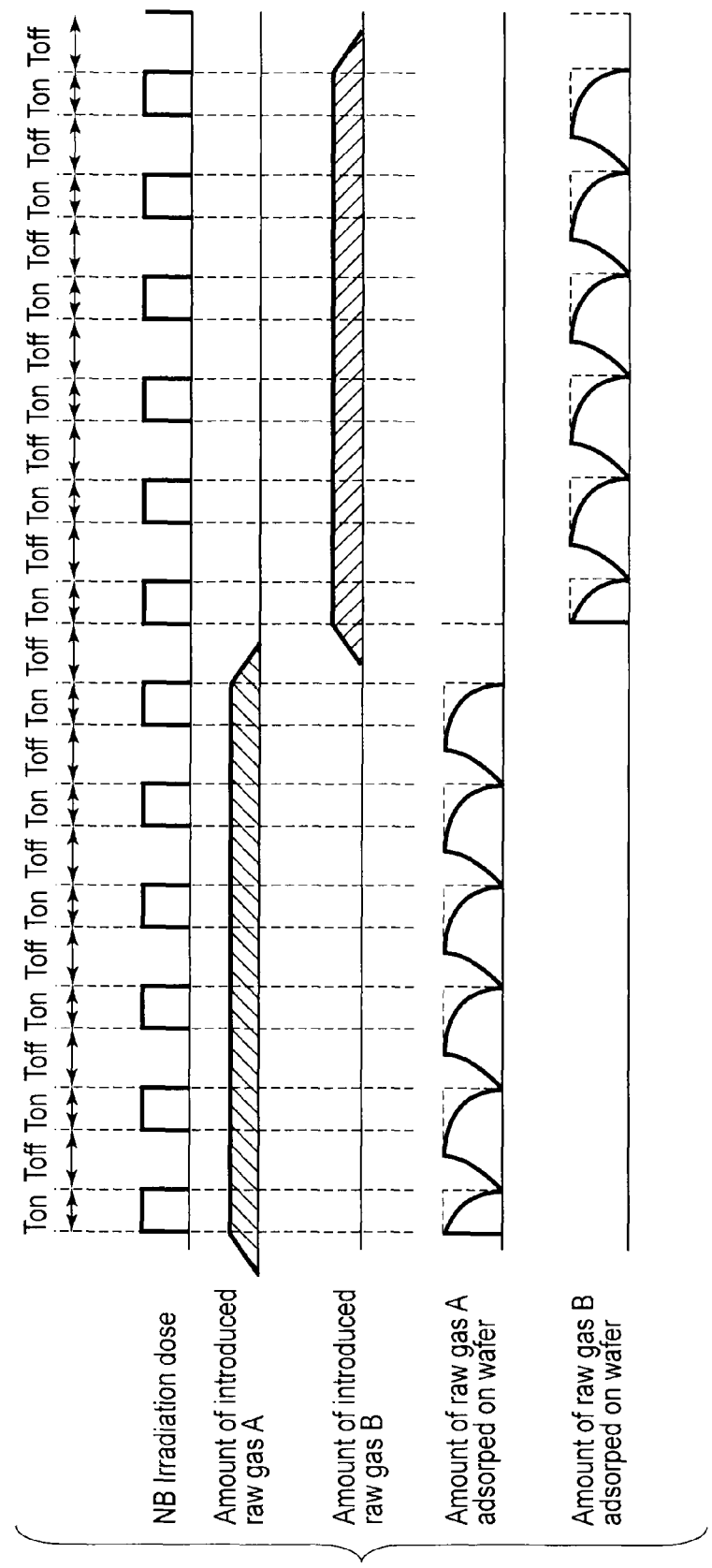
FIG. 10 is a view showing a NB irradiation sequence of NBE-CVD in a method of forming a low dielectric constant insulating film according to a modified example of a second embodiment of the present invention.

In FIG. 10, at first, a raw gas A is supplied, and the substrate is irradiated intermittently with NB in the similar manner with the embodiment shown in FIG. 9 to form a film on the substrate. Then, after the supply of the raw gas A is stopped, a raw gas B is supplied, and the substrate is irradiated intermittently with NB in the similar manner with the embodiment shown in FIG. 9 to form another film on the substrate. As a result, it is possible to form an insulating film having a two-layer structure of two kinds of films.

In the embodiment shown in FIG. 10, a cycle of NB irradiation is kept constant in both cases of supplying of a raw gas A and supplying of a raw gas B. However, it is possible to change a cycle of NB irradiation in each case of supplying of a raw gas A and supplying of a raw gas B. An embodiment in such a case is described in reference to NB radiation sequence shown in FIG. 11.

Figure 11:
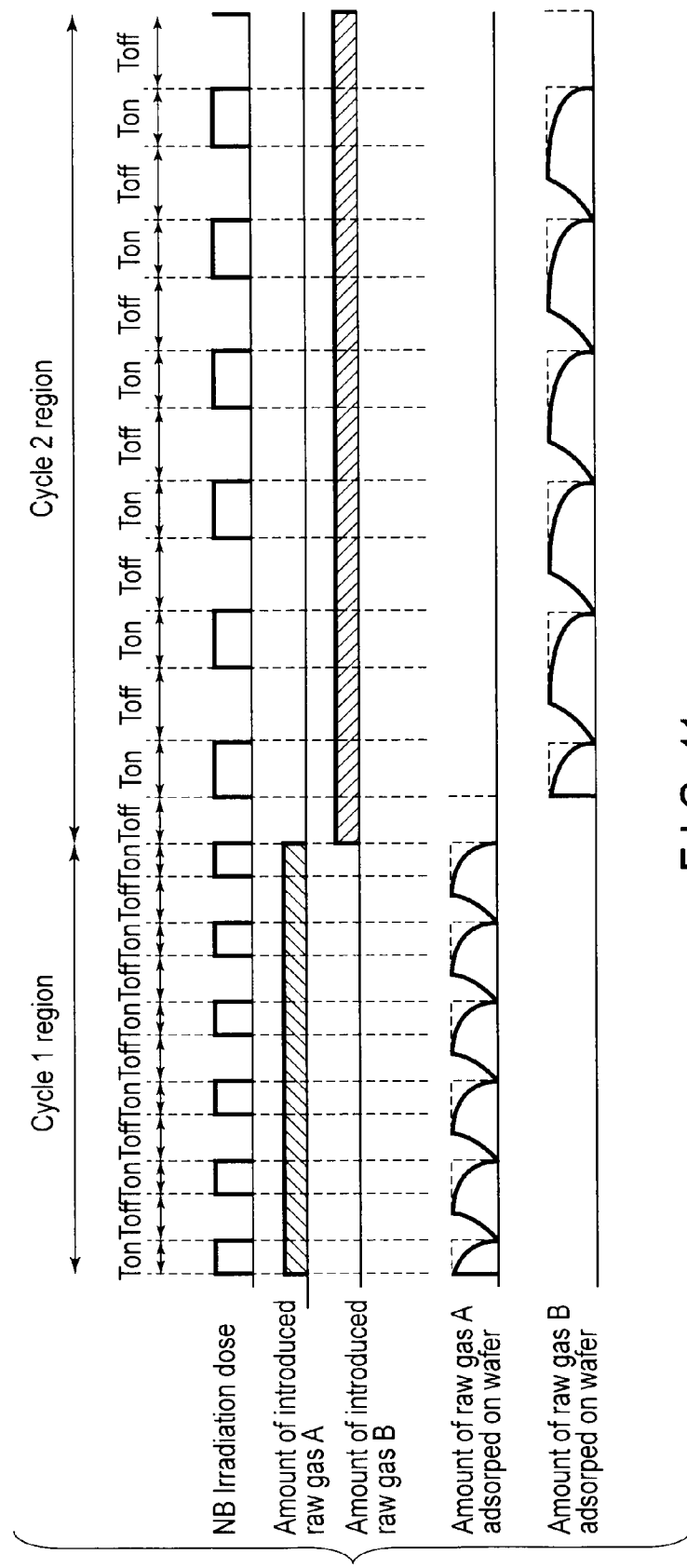
FIG. 11 is a view showing a NB irradiation sequence of NBE-CVD in a method of forming a low dielectric constant insulating film according to another modified example of a second embodiment of the present invention.

As shown in FIG. 11, at first, a raw gas A is supplied to the substrate, and the substrate is intermittently irradiated with NB at cycle 1 in the same manner as the embodiment shown in FIG. 10, thereby to form a film with regard to the raw gas A. Then, supply of the raw gas A is stopped, a raw gas B is supplied to the substrate, the substrate is intermittently irradiated with NB at cycle 2 which is longer than cycle 1, thereby to form a film with regard to the raw gas B. Thus, two-layer structure of two films formed of different materials can be obtained.

In the method of forming the insulating film of the present embodiment, it is possible to employ a compound having a siloxane bond as a raw gas. The compound employed in the first embodiment can be employed as the compound having a siloxane bond. Among the compounds, it is preferred to employ polymer of methyl siloxane containing two or more repeating units, for example, dimethoxy trimethyl disiloxane (DMOTMDS).

The NBE-CVD employed in the method of forming the insulating film according to the present embodiment is the same as that described in the first embodiment. In this case, when the substrate is continuously irradiated with neutral particle beams, the temperature of the substrate rises, whereby not only the amount of DMOTMDS adsorbed onto the substrate decreases, but also DMOTMDS adsorbed onto the substrate is spattered by means of the neutral particle beams. On the other hand, when the substrate is intermittently irradiated with neutral particle beams, the temperature of the substrate is prevented from rising, whereby sputtering of the DMOTMDS adsorbed onto the substrate is suppressed and an adsorbing probability of DMOTMDS is increased due to keeping of adsorbing time, and thus a straight chain structure of $2SiO(CH_3)_2$ is effectively trapped in the film. As a result, the low dielectric constant and strength of the film become compatible. Further, a film quality becomes uniform in the thickness direction, molecules remained in the film is reduced, and thus it is possible to obtained a high hydrophobic insulating film. Incidentally, since a concentration of C atoms in the insulating film attains 40%, the insulating film has a high resistance to plasma damage.

Thus, the method of the insulating film including intermittently irradiation of neutral particle beams according to the present embodiment enables forming of a low dielectric constant insulating film having a low dielectric constant, high strength, and high resistance to plasma damage like the first embodiment of the present invention described above.

The neutral particle beam irradiation type CVD (NBE-CVD) apparatus shown in FIG. 6 can be employed in the method of forming a low dielectric constant insulating film according to the second embodiment of the present invention described above. The method of forming a low dielectric constant insulating film employing this apparatus can be carried out as described above.

Next, there will be described various examples of the present invention.

EXAMPLE 1

Two kinds of insulating films were deposited on silicon substrates, respectively, employing the neutral particle beam irradiation type CVD apparatus shown in FIG. 6 and using DMDMOS and DMOTMDA as a raw gas. Each of the silicon substrates was continuously irradiated with neutral beams having energy of 10 eV. A pressure in a chamber was kept at 30 mTorr, and a temperature of the substrate was −20° C. Incidentally, an insulating film was deposited on a silicon substrate by the conventional plasma CVD (PECVD) using DMOTMDA as a raw gas as a comparative example.

Thus obtained three insulating films were analyzed by means of a Fourier transform infrared spectroscopy. k values of the insulating films were measured by means of Hg probe, and Young' moduli of the insulating films were measured by means of nanoindentor. These results were shown in the following Table 1.

TABLE 1

| | | | PECVD | C-NBE-CVD | |
| --- | --- | --- | --- | --- | --- |
| | | | DMOTMDS | DMDMOS | DMOTMDS |
| FTIR | SiO | Linear | 37 | 52.8 | 51.2 |
| | struc- | Network | 53 | 25.8 | 30.5 |
| | ture | Cage | 10 | 21.6 | 18.3 |
| | $CH_3$ | $Si(CH_3)_2$/ $Si(CH_3)_{1+2}$ | 42 | 62 | 85.7 |
| k value | | | 2.6 | 2.2 | 1.9 |
| Young' modulus | | | 7 | 7 | 4 |

As shown in the above Table 1, the insulating film formed by the NBE-CVD method contains a linear type SiO structure of 49% or more and $Si(CH_3)_2$ of 66% or more. As a result, k value dielectric constant of the insulating film is 2.2 when DMDMOS is used as a raw gas, and is 1.9 when DMOTMDS is used as a raw gas. These values are greatly lower than 2.6 which is k value of the insulating film formed by the conventional PECVD.

Incidentally, E (Young' modulus) is as high as 7 when DMDMOS is used as a raw gas. When DMOTMDS is used as a raw gas, Young' modulus of the insulating film is 4 which is lower than that of the insulating film formed by the conventional PECVD method and is a value permissible for practical use.

EXAMPLE 2

An insulating film was deposited on a silicon substrate in the same manner as in Example 1 except that DMOTMDA was used as a raw gas and the substrate was cooled to at a temperature of −70° C. The obtained film was analyzed by a Fourier transform infrared spectroscopy. k value of the insulating films was measured by means of Hg probe, and Young' modulus was measured by means of nanoindentor. These results were shown in the following Table 2. Table 2 showed also data of the insulating film formed by the conventional PECVD method in Example 1 and the insulating film formed by the NBE-CVD method with the substrate being cooled to −20° C.

TABLE 2

| | | | PECVD | C-NBE-CVD Substrate temperature | |
| --- | --- | --- | --- | --- | --- |
| | | | DMOTMDS | −20° C. | −70° C. |
| FTIR | SiO | Linear | 37 | 51.2 | 49.2 |
| | struc- | Network | 53 | 30.5 | 28.2 |
| | ture | Cage | 10 | 18.3 | 22.6 |
| | $CH_3$ | $Si(CH_3)_2$/ $Si(CH_3)_{1+2}$ | 42 | 85.7 | 89.2 |
| k value | | | 2.6 | 1.9 | 1.7 |
| Young' modulus (GPa) | | | 7 | 4 | 7 |

As shown in the above Table 2, the insulating film formed by the NBE-CVD method with the temperature of the substrate being cooled to −70° C. contains a linear type SiO structure of 49% or more and $Si(CH_3)_2$ of 66% or more. As a result, k value dielectric constant is 1.7 and Young' modulus is 7. These values are lower k value and higher Young' modulus than the values of the insulating film formed by the NBE-CVD method with the substrate being cooled to −20° C.

FIGS. 12A and 12B are diagrams showing a spectrum obtained by analyzing the insulating films formed by the NBE-CVD method with the substrate being cooled to −20° C. and −70° C., respectively, by means of a Fourier transform infrared spectroscopy.

FIG. 12A shows a case of the substrate temperature of −20° C., and FIG. 12B shows a case of the substrate temperature of −70° C. It is found that an amount of methyl group is increased by lowering the temperature of the substrate to −70° C. (a peak of $Si(CH_3)_2$ becomes high). This means that probability of adsorption onto the substrate increases depending on lowering of the temperature of the substrate.

EXAMPLE 3

An insulating film was deposited on a silicon substrate in the same manner as in Example 2 except that the substrate was irradiated with neutral beams in a pulsed form. The film was formed in such a condition that pulse-on time was fixed to 50 μs, and pulse-off time was changed. Thus obtained films were analyzed by means of a Fourier transform infrared spectroscopy and change in composition of SiO structure was examined. The results are shown in FIG. 13.

As shown in FIG. 13, a content of linear structure molecules in the insulating film increases as the pulse-off time increases. In particular, a content of linear structure molecules in the insulating film attains to 52% or more in a pulse-off time of 100-200 μs, and on the other hand, a content of network structure molecules decreases. As a result, k value decreases to 1.3 and Young' modulus of more than 5 GPa is obtained.

EXAMPLE 4

An insulating film was deposited on a silicon substrate employing the neutral particle beam irradiation type CVD apparatus shown in FIG. 6 and using DMOTMDA as a raw gas. The film was formed in such a condition that pulse-on time was fixed to 50 μs, and pulse-off time was changed. The substrate was irradiated with neutral beams in a pulsed form to form a insulating film. A temperature of the substrate was set to −70° C.

FIG. 14 shows film forming speed (nm/min.) depending on pulse-off time.

As shown in FIG. 14, the film forming speed increases as the pulse-off time increases. In particular, a high film forming speed is obtained in the case of pulse-off time of 100-200 μs. This means that amounts of DMOTMDS adsorbed onto the substrate increases depending on increase in pulse-off time.

EXAMPLE 5

An insulating film was deposited on a silicon substrate in the same manner as in the Example 1 except that the substrate was irradiated with neutral beams in a pulsed form in such a condition that pulse-on time was fixed to 50 μs, and pulse-off time was changed, to form a insulating film. k value of the insulating films was measured by means of Hg probe, and Young' modulus was measured by means of nanoindentor. Further, relative densities of Si—$(CH_3)_x$ and Si—O were measured. The results are shown in FIG. 15.

As shown in FIG. 15, the k value decreases and relative density of Si—$(CH_3)_x$ increases as the pulse-off time increases. The Young' modulus and relative density of Si—O do not much vary.

EXAMPLE 6

An insulating film was deposited on a silicon substrate employing the neutral particle beam irradiation type CVD apparatus shown in FIG. 6 and using DMOTMDA as a raw gas. The film was formed in such a condition that pulse-on time was set to 50 μs, and pulse-off time was set to 100 μs. The substrate was irradiated with neutral beams in a pulsed form to form a insulating film. A temperature of the substrate was set to −70° C.

As a result, the insulating film having a dielectric constant k of 1.7 and Young' modulus of about 5 GPa. A concentration of C atoms in this insulating film attains about 40%. Even if the film is subjected to thermal annealing up to a temperature of 450° C., no gas generates and absorbed water is not detected. This shows the film is an excellent low dielectric constant film.

EXAMPLE 7

After an insulating film having a thickness of 100 nm was deposited on a silicon substrate in the same manner as in the Example 6 except that methyltrimethoxy siloxane (MTMOS) was employed as a raw gas, the raw gas was changed from MTMOS to dimethoxytrimethy disiloxane (GMOTMDOS), and another insulating film having a thickness of 100 nm was deposited on thus formed insulating film in the same manner as in the Example 6 to obtain a laminated insulating film of a two-layer structure.

As a result, there was formed the laminated insulating film of a two-layer structure having a dielectric constant k of 1.7 and Young' modulus of about 5 GPa and including an upper layer and lower layer different in quality. A concentration of C atoms in this laminated insulating film attains about 40%. Even if the film is subjected to thermal annealing up to a temperature of 450° C., no gas generates and absorbed water is not detected. This shows the film is an excellent low dielectric constant film.

EXAMPLE 8

After an insulating film having a thickness of 100 nm was deposited on a silicon substrate at a temperature of −20° C. by continuously irradiating with neutral beams, the substrate was irradiated with neutral beams in a pulsed form in such a condition that pulse-on time was set to 50 μs, and pulse-off time was set to 100 μs, to form another insulating film.

As a result, the laminated insulating film of a two-layer structure including an upper layer and lower layer different in quality.

The present invention is not limited to the embodiments and Examples described above. It is possible to change voluntarily in kinds of a raw gas, cycle of intermittent irradiation, a thickness of a film, and a temperature of a substrate, and to combine any one of these parameters. A any combination of the parameters can be applied to a laminated hard mask, an interlayer insulating film of a two-layer structure having an etching selectivity, a side wall protective layer, and pore sealing film.

What is claimed is:

1. A low dielectric constant insulating film formed of a polymer containing Si atoms, O atoms, C atoms, and H atoms, which comprises:
   straight chain molecules in which a plurality of basic molecules with an SiO structure are linked in a straight chain; and
   binder molecules with an SiO structure linking a plurality of the straight chain molecules,
   wherein the area ratio of a signal indicating a linear type SiO structure is 49% or more, when the total of the signal areas of a peak signal indicating a linear SiO structure appearing in the vicinity of wavenumber of 1020 cm$^{-1}$, a peak signal indicating a network SiO structure appearing in the vicinity of wavenumber of 1080 cm$^{-1}$, and a peak signal indicating a cage SiO structure appearing in the vicinity of wavenumber of 1120 cm$^-$ from among the peak signals of a spectrum obtained by analyzing said low dielectric constant insulating film by a Fourier transform infrared spectroscopy, is 100%,
   the signal amount of the signal indicating Si(CH$_3$)$_2$ is 66% or more, when the total of the signal amounts of a signal indicating Si(CH$_3$) appearing in the vicinity of wavenumber of 770 cm$^{-1}$ and a signal indicating Si(CH$_3$)$_2$ appearing in the vicinity of wavenumber of 800 cm$^{-1}$ from among the peak signals of said spectrum, is 100%, and
   the low dielectric constant insulating film has a dielectric constant k of 2.2 or less.

2. The low dielectric constant insulating film according to claim 1, wherein
   the low dielectric constant insulating film has a porosity of 50% or less.

3. The low dielectric constant insulating film according to claim 1, wherein the area ratio of the signal indicating the cage SiO structure is 10 to 25%.

4. The low dielectric constant insulating film according to claim 1, wherein the signal amount of the signal indicating Si(CH$_3$)$_2$ is 80% or more.

5. The low dielectric constant insulating film according to claim 1, wherein the linear molecule is dimer or higher oligomer of methyl siloxane, and the binder molecule is one selected from the group consisting of SiO$_2$, SiO$_{1.5}$(CH$_3$), and SiO(CH$_3$)$_2$.

6. The low dielectric constant insulating film according to claim 1, wherein a content of C atoms is 36-50 atomic % when the total amount of the Si atoms, O atoms, C atoms, and H atoms in the polymer containing Si atoms, O atoms, C atoms, and H atoms is 100%.

7. The low dielectric constant insulating film according to claim 1, which is produced by a neutral-beam-enhanced CVD process using dimer or higher oligomer of methyl siloxane as a raw gas.

8. The low dielectric constant insulating film according to claim 7, wherein dimer or higher oligomer of methyl siloxane is dimethoxy tetramethyl disiloxane.

9. A method of forming the low dielectric constant insulating film of claim 1, which comprises irradiating a substrate placed in an atmosphere of a raw gas with neutral beams, and dissociating the raw gas adsorbed to a surface of the substrate to cause polymerization and thereby to form a low dielectric constant insulating film,
   wherein the substrate is intermittently irradiated with the neutral beams in a 1 millisecond cycle.

10. The method according to claim 9, wherein irradiation time T$_{on}$ and irradiation cycle T$_{off}$ of the neutral beams satisfy inequality T$_{on}$≤T$_{off}$.

11. The method according to claim 10, wherein the irradiation time T$_{on}$ is larger than 50 μseconds and the irradiation cycle T$_{off}$ is larger than 50 μseconds.

12. The method according to claim 9, wherein the raw gas comprises a compound having a siloxane bond.

13. The method according to claim 12, wherein the compound having a siloxane bond is a dimer or higher oligomer of methylsiloxane.

14. The method according to claim 13, wherein the dimer or higher oligomer of methylsiloxane is dimethoxytrimethyldisiloxane.

15. The method according to claim 9, wherein the substrate is cooled to a temperature of 0° C. or less.

16. The low dielectric constant insulating film according to claim 1, wherein the low dielectric constant insulating film has the dielectric constant k of 2.0 or less.

17. The low dielectric constant insulating film according to claim 16, wherein the low dielectric constant insulating film has the dielectric constant k of 1.9 or less.

* * * * *